(12) United States Patent
Rafati

(10) Patent No.: US 7,902,874 B1
(45) Date of Patent: Mar. 8, 2011

(54) COMBINED FULL SPEED AND HIGH SPEED DRIVER

(75) Inventor: Saied Rafati, Saratoga, CA (US)

(73) Assignee: Exar Corporation, Fremont, CA (US)

( * ) Notice: Subject to any disclaimer, the term of this patent is extended or adjusted under 35 U.S.C. 154(b) by 0 days.

(21) Appl. No.: 12/792,968

(22) Filed: Jun. 3, 2010

(51) Int. Cl.
*H03K 19/094* (2006.01)
*H03K 19/0175* (2006.01)

(52) U.S. Cl. .................. 326/86; 326/30; 326/34; 326/83

(58) Field of Classification Search .................. None
See application file for complete search history.

(56) References Cited

U.S. PATENT DOCUMENTS

| | | | |
|---|---|---|---|
| 6,566,911 B1 * | 5/2003 | Moyer | 326/83 |
| 2007/0049235 A1 * | 3/2007 | Kyung | 455/313 |

OTHER PUBLICATIONS

Sim, et al., "A 1-Gb/s Bidirectional I/O Buffer Using the Current-Mode Scheme", IEEE Journal of Solid-State Circuits, Apr. 1999, pp. 529-535, vol. 34, No. 4.

* cited by examiner

*Primary Examiner* — Anh Q Tran
(74) *Attorney, Agent, or Firm* — Fliesler Meyer LLP

(57) ABSTRACT

The separate high speed and full speed drivers used in a Universal Serial Bus 2.0 application can be combined into one driver which functions both as full speed/high speed driver and as a result provides output impedance for the full speed/high speed modes which is less process dependent.

22 Claims, 3 Drawing Sheets

Full Speed

High Speed

High Speed/Full Speed

COMBINED FULL SPEED AND HIGH SPEED DRIVER

FIELD OF THE INVENTION

The present invention relates to combined mode drivers for buses, such as the Universal Serial Bus (USB).

BACKGROUND

USB (Universal Serial Bus) is a specification to establish communication between devices and a host controller (such as a personal computer). Universal Serial Bus (USB) is intended to replace many varieties of serial and parallel ports. USB devices can connect computer peripherals such as mice, keyboards, digital cameras, printers, personal media players, flash drives, and external hard drives. For many of those devices, USB has become the standard connection method. USB was designed for personal computers, but it has become commonplace on other devices such as Smartphones, Personal Digital Assistants (PDAs) and video game consoles, and as a power cord between a device and an AC adapter plugged into a wall plug for charging. As of 2008, there were about two billion USB devices sold per year, and approximately six billion total sold.

USB 1.0 and 1.1 specify a "full speed" data rate of 12 Mbit/s. Universal Serial Bus 2.0 (USB2) adds a higher maximum bandwidth of 480 Mbit/s (called "Hi-Speed" or "high speed").

FIG. 1 and FIG. 2 show a possible implementation of full speed and high speed driver, respectfully. For a full speed driver, the USB specification requirement for the output impedance from a high speed output ($V_o^+$ or $V_o^-$) to ground or to the supply voltage, $V_{dd}$, is $28 < Z_o < 44$ ohms. In FIG. 1, the output impedance from the output ($V_o^+$ or $V_o^-$) with respect to the supply voltage, $V_{dd}$, is the impedance of the resistor 102 or 104 plus the impedance of the transistor 106 or 108. The output impedance from the output ($V_o^+$ or $V_o^-$) with respect to ground is the impedance of the actual resistor 102 or 104, plus the impedance of the transistor 110 or 112. The resistor value is the major contribution to the output impedance and the transistors 106, 108, 110 or 112 are sized with respect to the impedance of the resistor to meet the output impedance requirement of the USB specification.

Looking at FIG. 2, in the high speed driver, the specification requirement for output impedance from each output ($V_o^+$ and $V_o^-$) respect to ground is $40.5 < Z_o < 49.5$ ohms. The output impedance ($Z_o$) with respect to ground is the impedance of the resistors 202 or 204 plus the output impedance of the transistor 206 or 208. Since high speed drivers have such a tight impedance requirement, a fix resistor (~40 ohms) and a feedback system can be used to control the impedance of transistors 206 and 208.

In a USB2 upstream device, When the full speed driver is part of high speed capable transceiver, the impedance of each of the drivers (full and high speed) must be $40.5 < Z_o < 49.5$ ohms.

SUMMARY OF THE PRESENT INVENTION

A combined full speed and high speed driver uses a feedback circuit to control the output impedance in a path from a shared full speed and high speed output to ground. The feedback circuit uses an external resistor so that the impedances through transistors connected to the feedback circuit are functions of the external resistor. The external resistor can be selected to have a precise impedance value so that the output impedance from the shared full speed and high speed output can be ensured to be within the USB specification.

Additional circuitry associated with the feedback circuit is used to control the impedance from the shared full speed and high speed output to the supply voltage, $V_{dd}$. This circuitry can use a less process dependent current produced using the feedback circuit to keep the output impedance from the shared full speed and high speed output to the supply voltage within the requirements of the USB specification.

DETAILED DESCRIPTION OF THE PRESENT INVENTION

Figure 1:
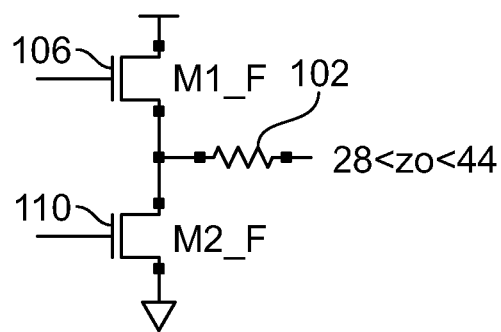
FIG. 1 shows a prior art full speed driver for a USB system.
Figure 1:
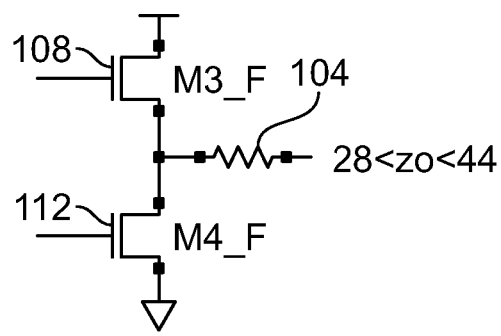
Figure 2:
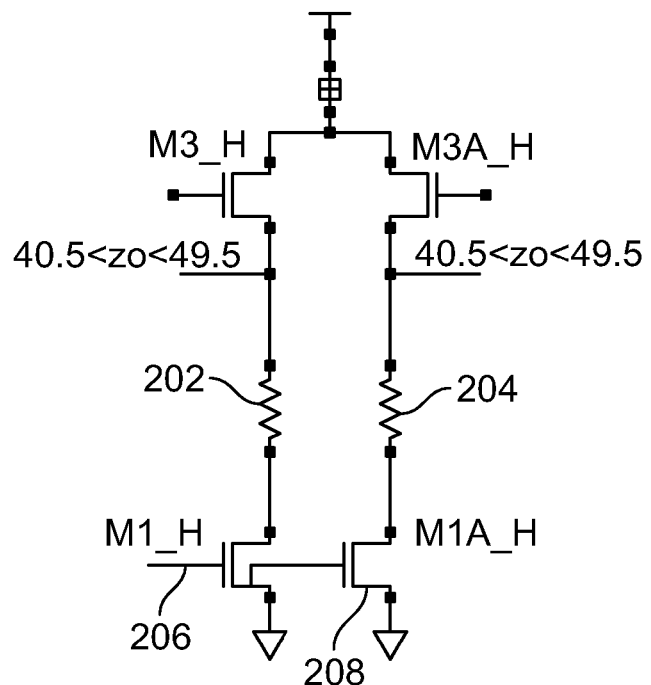
FIG. 2 shows a prior art high speed driver for a USB system.
Figure 3:
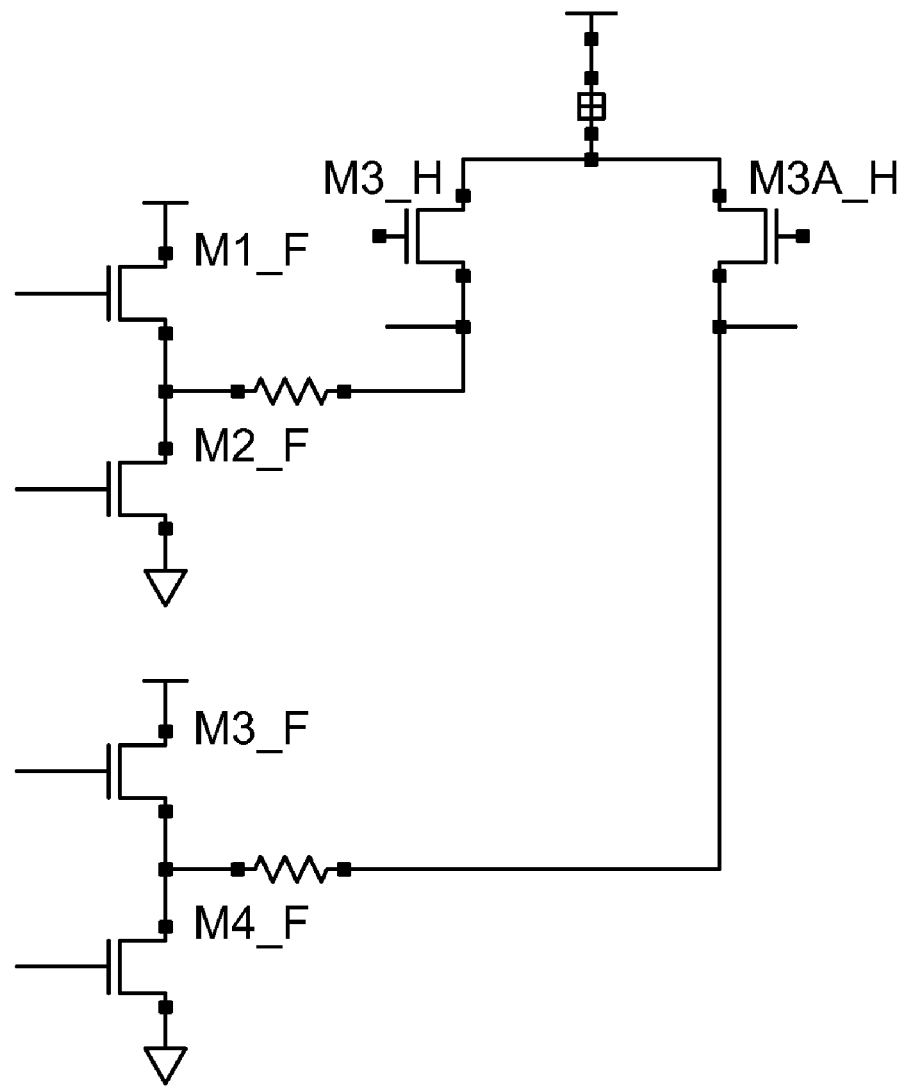
FIG. 3 shows a combined high speed/full speed driver design that would have trouble meeting the output impedance requirement of the USB specification because of process variations.

FIG. 3 shows a possible implementation of combined upstream USB2 driver that is full speed and high speed capable. The challenge for the design of FIG. 3 is to meet the USB specification's full speed driver output impedance requirements of $40.5 < Z_o < 49.5$ since the normal process variation of resistors and devices will likely be more than what the USB2 specification allows.

Figure 4:
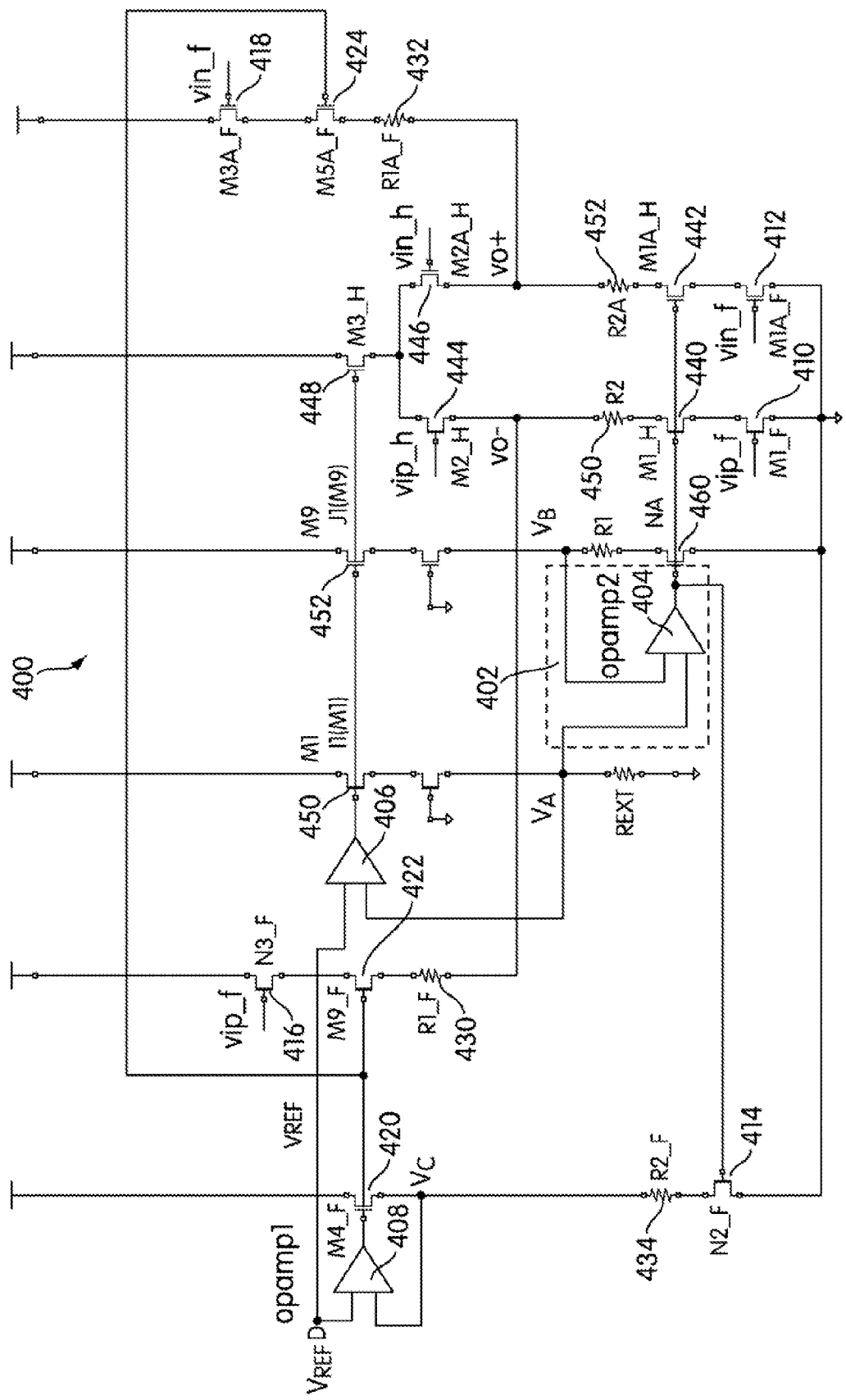
FIG. 4 shows a combined high speed/full speed driver that uses a feedback circuit connected to an external resistor to control the output impedance.

FIG. 4 shows a combined full speed and high speed driver 400 of one embodiment of the present invention. There are separate full speed inputs vin_f and vip_f and high speed inputs vin_h and vip_h. Circuitry connects the separate full speed and high speed inputs to at least one shared full speed and high speed outputs, $V_o^+$ and $V_o^-$. A feedback circuit 402 is used to control the output impedance to ground of the at least one shared full speed and high speed output $V_o^+$ and $V_o^-$. The feedback circuit 402 is adapted to be connected to an external resistor, $R_{ext}$. The feedback circuit 402 is connected to one or more gates of one or more transistors 460, 440, 442 and 414. The feedback circuit 402 adjusts the voltage at the one or more gates, such that, when the feedback circuit 402 is connected to the external resistor $R_{ext}$, the one or more transistors 460, 440, 442 and 414 have impedances that are a function of the impedance of the external resistor.

The driver can be a full speed/high speed USB driver. The driver can also be another bus driver that uses two modes other than high speed and full speed mode.

The feedback circuit 402 is used to adjust the impedance in a path from at least one shared first and second mode output to ground to compensate for process variation of internal resistors. Additional circuitry associated with the feedback circuit 402 adjusts the impedance of at least one additional path from at least one shared first and second mode output to a supply voltage. In one embodiment, the first mode can be a full speed mode, and the second mode can be a high speed mode.

The output impedance to ground circuitry is shared for high speed and full speed modes and the circuit also provides a less process dependent current to be used for setting the output impedance to the supply voltage, $V_{dd}$, for full speed operation.

In FIG. 4, the feedback circuit 402 is connected to a gate of a first transistor 460 of the one or more transistors, the first transistor's impedance being adjusted using feedback from the feedback circuit 402. The feedback circuit 402 includes an Op Amp 404 with one input adapted to be connected to the external resistor $R_{ext}$ when the external resistor $R_{ext}$ is connected to ground.

The other input of the Op Amp 404 is connected to a resistor $R_1$, the first transistor 460 is connected to the resistor $R_1$ and connected to ground. When the external resistor $R_{ext}$ is connected to the feedback circuit 402, the Op Amp 404 sets $V_A$ equal to $V_B$ by adjusting the impedance of the first transistor 460. Since the current through $R_{ext}$ and the current through resistor $R_1$ and transistor 460 are set to be equal by Op Amp 406 and transistors 450 and 452, Op Amp 404 sets the impedance of the first transistor 460 equal to the impedance of the external resistor $R_{ext}$ minus the impedance of resistor $R_1$.

The feedback circuit 402 is further connected to a gate of a second transistor 440 and third transistor 442 of the one or more transistors. The second transistor 440 being in a path from one of the at least one shared full speed and high speed outputs to ground. The third transistor 442 being in another path from another of the at least one shared full speed and high speed outputs to ground. In this way, the external resistor value is used to set the impedance to ground of the outputs.

The path from one of the at least one shared full speed and high speed outputs to ground further includes a full speed mode input transistor 410, the full speed mode input transistor 410 having a gate connected to a full speed input in full speed mode and the full speed input mode transistor 410 set to high in high speed mode.

The voltage at the input nodes of the Op Amp 404 is set to a reference voltage using a second Op Amp 406.

The feedback circuit is connected to another transistor 414 of the more than one transistors, the another transistor 414 matching the first transistor 460. The current through the first transistor 460 and transistor 414 are made to be similar because additional Op Amp 408 sets $V_c$ equal to $V_{ref}$ which causes transistors 414 and 460 to have the same $V_{ds}$. The Op Amp 408 also sets the voltage at the gates of transistors 422 and 424 and thus reduces the dependence of the impedance in the path from the at least one full and high speed output to the supply voltage, $V_{DD}$, to process variations.

Transistors 410, 412, 414, 416, 418, 420, 422 and 424 and resistors 430, 432 and 434 and Op Amp 408 have been added to realize full speed operation to the existing high speed driver realized by transistors 440, 442, 444, 446 and 448 and resistors 450 and 452. The output impedance from $V_o^+$ and $V_o^-$ to ground uses the same circuits both in high and full speed operation. The transistors 410 and 412 are turned on in the high speed mode and are driven by signal vip_f and vin_f during full speed operation. For the purpose of output impedance, one of transistors 410 or 412 will be on in full speed operation. In this way, the output impedance to ground can be shared between high and full speed modes and will be the same as in the high speed mode which is controlled by the feedback circuit 402 and is accurate.

Resistor, $R_{ext}$, is connected outside the chip and is very accurate. $V_{ref}$ is generated from bandgap and is very process independent. $V_{ref}$ is propagated using the Op Amps 406 and 408 which sets the voltages $V_A$, $V_B$ and $V_C$ equal to $V_{ref}$. During high speed operation, the current through transistor 450 is defined as $I_{M1}$ where:

$$I_{M1} = V_A / R_{ext} \quad (1)$$

Additionally, $V_A = V_B = V_{REF}$, (2)

as a result of the operation of Op Amps 406 and 408, where $V_{REF}$ is generated from bandgap and is fixed.

The current through transistor 452 is defined as $I_{M9}$ where $$I_{M9} = I_{M1} \quad (3)$$

since transistors 450 and 452 are matching transistors that are biased in the same way. Further, $$V_B = I_{M9}(R1 + Z_{MA}) \quad (4)$$

where the impedance of transistor 460 is defined as $Z_{MA}$

As a result of equations (1), (2), (3) and (4), $$R1 + Z_{MA} = R_{ext}$$

where $R_{ext}$ is externally connected and fixed. Since $V_B$ and $I_{M9}$ are fixed, the feedback from Op Amp 404 sets $Z_{MA}$ and $R_o = (R1 + Z_{MA})$ will also be fixed.

By the replica biasing method, we can match the output impedances to ground for the two shared outputs, $Z_o^+$ and $Z_o^-$, as:

$$Z_o^+ = R2 + Z_{M1\_H} = R_o$$

$$Z_o^- = R2A + Z_{M1A\_H} = R_o$$

Where R2 is the resistance of resistor 450, R2A is the resistance of resistor 452, ZM1_H is the impedance of transistor 440 and $Z_{M1A\_H}$ is the impedance of transistor 442.

Transistors 410 and 412 are purposely large such that their variation does not affect the total output impedance. The transistor 414 and resistor 434 and Op Amp 408 and transistor 420 replicates the current through transistor 460 accurately through transistor 414. Since transistors 460 and 414 have the same drain-source bias, $V_{gs}$, and the same drain-source bias, $V_{ds}$, and resistor R1 and resistor 434 are the same, then the current through both transistors 460 and 414 match.

As discussed above, the impedance of transistors 422 and 424 are made to be less process dependent causing the output impedance of driver outputs ($V_o^-$, $V_o^+$) to the source voltage, $V_{dd}$ to be less process dependent since the output impedance to the supply voltage is a function of the resistor 430 and transistors 422 and 416 for output $V_o^-$ and a function of resistor 432 and transistors 424 and 418 for output $V_o^+$. Transistors 416 and 418 are purposely large such that their variation does not affect the total output impedance.

The foregoing description of preferred embodiments of the present invention has been provided for the purposes of illustration and description. It is not intended to be exhaustive or to limit the invention to the precise forms disclosed. Many embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalents.

The invention claimed is:

1. A combined full speed and high speed driver for a bus system comprising:
   separate full speed and high speed inputs;
   at least one shared full speed and high speed output;
   circuitry to connect the separate full speed and high speed inputs to the at least one shared full speed and high speed output;
   a feedback circuit used to control the output impedance to ground of the at least one shared full speed and high speed output, the feedback circuit adapted to be connected to an external resistor, the feedback circuit connected to one or more gates of one or more transistors, the feedback circuit adjusting the voltage at the one or more gates such that, when the feedback circuit is connected to the external resistor, the one or more transistors have impedances that are a function of the impedance of the external resistor.

2. The driver of claim 1, wherein the feedback circuit is connected to a gate of a first transistor of the one or more transistors, the first transistor's impedance being adjusted using feedback from the feedback circuit.

3. The driver of claim 1, wherein the feedback circuit includes an Op Amp with one input adapted to be connected to the external resistor when the external resistor is connected to ground.

4. The driver of claim 3, wherein the other input of the Op Amp is connected to a resistor $R_1$, the first transistor connected to the resistor $R_1$ and connected to ground, wherein, when the external resistor is connected to the feedback circuit, the Op Amp adjusts the impedance of the first transistor.

5. The driver of claim 2, wherein the feedback circuit is further connected to a gate of a second transistor of the one or more transistors, the second transistor being in a path from one of the at least one shared full speed and high speed outputs to ground.

6. The driver of claim 5, wherein the feedback circuit is further connected to the gate of a third transistor of the one or more transistors, the third transistor being in another path from another of the at least one shared full speed and high speed outputs to ground.

7. The driver of claim 5, wherein the path from one of the at least one shared full speed and high speed outputs to ground further includes a full speed mode input transistor, the full speed mode input transistor having a gate connected to a full speed input in full speed mode and the full speed input mode transistor set to high in high speed mode.

8. The driver of claim 3, wherein the voltage at the input nodes of the Op Amp is set to a reference voltage using a second Op Amp.

9. The driver of claim 8, wherein the reference voltage is a band gap voltage.

10. The driver of claim 2, wherein the feedback circuit is connected to another transistor of the more than one transistors, the another transistor matching the first transistor, wherein the current through the first transistor and the another transistor are made to be similar.

11. The driver of claim 10, further comprising an additional Op Amp to mirror the current to at least one path from the at least one full speed and high speed output to a supply voltage so as to reduce the dependence of the impedance in the path from the at least one full and high speed output to the supply voltage to process variations.

12. The driver of claim 1, further comprising the external resistor.

13. The driver of claim 1, wherein the driver is a USB (Universal Serial Bus) driver.

14. A combined driver for a bus system comprising:
separate first and second mode inputs; and
at least one shared first and second mode output;
circuitry to connect the separate first and second mode inputs to the at least one shared first and second mode output; and
a feedback circuit to control the output impedance to ground of the at least one shared first and second mode output, the feedback circuit adapted to be connected to an external resistor, the feedback circuit connected to one or more gates of one or more transistors and the feedback circuit adjusting the voltage at the one or more gates such that when the feedback circuit is connected to the external resistor, the one or more transistors have an impedance that are a function of the external resistor.

15. The driver of claim 14, wherein the feedback circuit is connected to a gate of a first transistor of the one or more transistors, the first transistor's impedance being adjusted using feedback from the feedback circuit.

16. The driver of claim 14, wherein the feedback circuit includes an Op Amp with one input adapted to be connected to the external resistor when the external resistor is connected to ground.

17. The driver of claim 16, wherein the other input of the Op Amp is connected to a resistor $R_1$, the first transistor connected to the resistor $R_1$ and connected to ground, wherein, when the external resistor is connected to the feedback circuit, the Op Amp adjusts the impedance of the first transistor.

18. The driver of claim 15, wherein the feedback circuit is further connected to a gate of a second transistor of the one or more transistors, the second transistor being in a path from one of the at least one shared first and second mode output to ground.

19. The driver of claim 15, wherein the feedback circuit is connected to another transistor of the one or more transistors, the another transistor matching the first transistor, wherein the current through the first transistor and the another transistor are made to be similar.

20. The driver of claim 19, further comprising an additional Op Amp to mirror the current to at least one path from the at least one shared first and second mode output to a supply voltage so as to reduce the dependence of the impedance in the path from the at least one first and second mode output to the supply voltage to process variations.

21. A combined driver for a bus system comprising:
separate first and second mode inputs; and
at least one shared first and second mode output;
circuitry to connect the separate first and second mode inputs to the at least one shared first and second mode output; and
a feedback circuit adapted to be connected to an external resistor, the feedback circuit used to adjust the impedance in a path from at least one shared first and second mode output to ground to compensate for process variation of internal resistors.

22. The driver of claim 21, further comprising additional circuitry associated with the feedback circuitry to adjust the impedance of at least one additional path from the at least one shared first and second mode output to a supply voltage.

* * * * *